(12) United States Patent
Nagata et al.

(10) Patent No.: US 6,518,803 B2
(45) Date of Patent: Feb. 11, 2003

(54) OUTPUT CIRCUIT

(75) Inventors: Junichi Nagata, Okazaki (JP); Akio Kojima, Aichi-ken (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/052,981

(22) Filed: Nov. 8, 2001

(65) Prior Publication Data

US 2002/0140465 A1 Oct. 3, 2002

(30) Foreign Application Priority Data

Nov. 8, 2000 (JP) ........................................ 2000-340495

(51) Int. Cl.[7] ................................................. H03K 3/00
(52) U.S. Cl. ........................................ 327/108; 327/130
(58) Field of Search ................................ 327/108, 109, 327/110, 112, 130, 134, 142, 143, 80; 307/113, 116, 125, 126, 130, 131

(56) References Cited

U.S. PATENT DOCUMENTS

| | | | |
|---|---|---|---|
| 5,872,474 A | | 2/1999 | Kagomiya et al. ........... 327/130 |
| 5,952,740 A | * | 9/1999 | Maeda et al. ................ 307/130 |
| 6,034,556 A | | 3/2000 | Koyasu et al. ................ 327/91 |
| 6,046,613 A | * | 4/2000 | Tamura ....................... 327/108 |
| 6,084,363 A | * | 7/2000 | Mizumoto .................. 318/116 |

FOREIGN PATENT DOCUMENTS

| JP | 5-55892 | 3/1993 |
|---|---|---|
| JP | 5-283998 | 10/1993 |
| JP | 6-214665 | 8/1994 |
| JP | 6-335176 | 12/1994 |
| JP | 7-30339 | 1/1995 |
| JP | 7-50531 | 2/1995 |
| JP | 7-142938 | 6/1995 |
| JP | 8-242598 | 9/1996 |
| JP | 9-51260 | 2/1997 |
| JP | 9-261016 | 10/1997 |
| JP | 10-41792 | 2/1998 |
| JP | 10-224165 | 8/1998 |
| JP | 11-168331 | 6/1999 |

* cited by examiner

*Primary Examiner*—Timothy P. Callahan
*Assistant Examiner*—Linh Nguyen
(74) *Attorney, Agent, or Firm*—Harness, Dickey & Pierce, PLC (57) ABSTRACT

The present invention discloses an output circuit, by which it is possible to reduce power consumption while maintaining maximum voltage value to be outputted at high level. In this output circuit, a charge-and-discharge circuit uses a terminal voltage Vc of a capacitor as a trapezoidal wave voltage, and a drive circuit drives an output transistor based on the terminal voltage Vc, and a voltage Vo equal to the terminal voltage Vc is outputted to the load. A voltage detection circuit detects an emitter voltage (Vc+VF) of the transistor and generates an electric current proportional to the terminal voltage Vc. This electric current is turned to a base current of the output transistor via a variable current circuit. Therefore, a base current proportional to the output voltage Vo is supplied to the output transistor.

11 Claims, 12 Drawing Sheets

OUTPUT CIRCUIT

BACKGROUND OF THE INVENTION

1. Field of the Invention

The present invention relates to an output circuit for outputting a voltage corresponding to a charging voltage of a capacitor to a load.

2. Related Art

For instance, a communication signal output circuit used on board of a vehicle is designed to output a trapezoidal wave signal with low slew rate in leading and trailing edges for the purpose of reducing radio noise by suppressing induction radiation from communication lines installed in the vehicle. This type of trapezoidal wave generating circuit has been proposed, for instance, in JP-A-6-214665 or JP-A-9-261016. In a circuit of this type, a trapezoidal wave signal is generated by performing charging and discharging at constant current to a capacitor.

Figure 11:
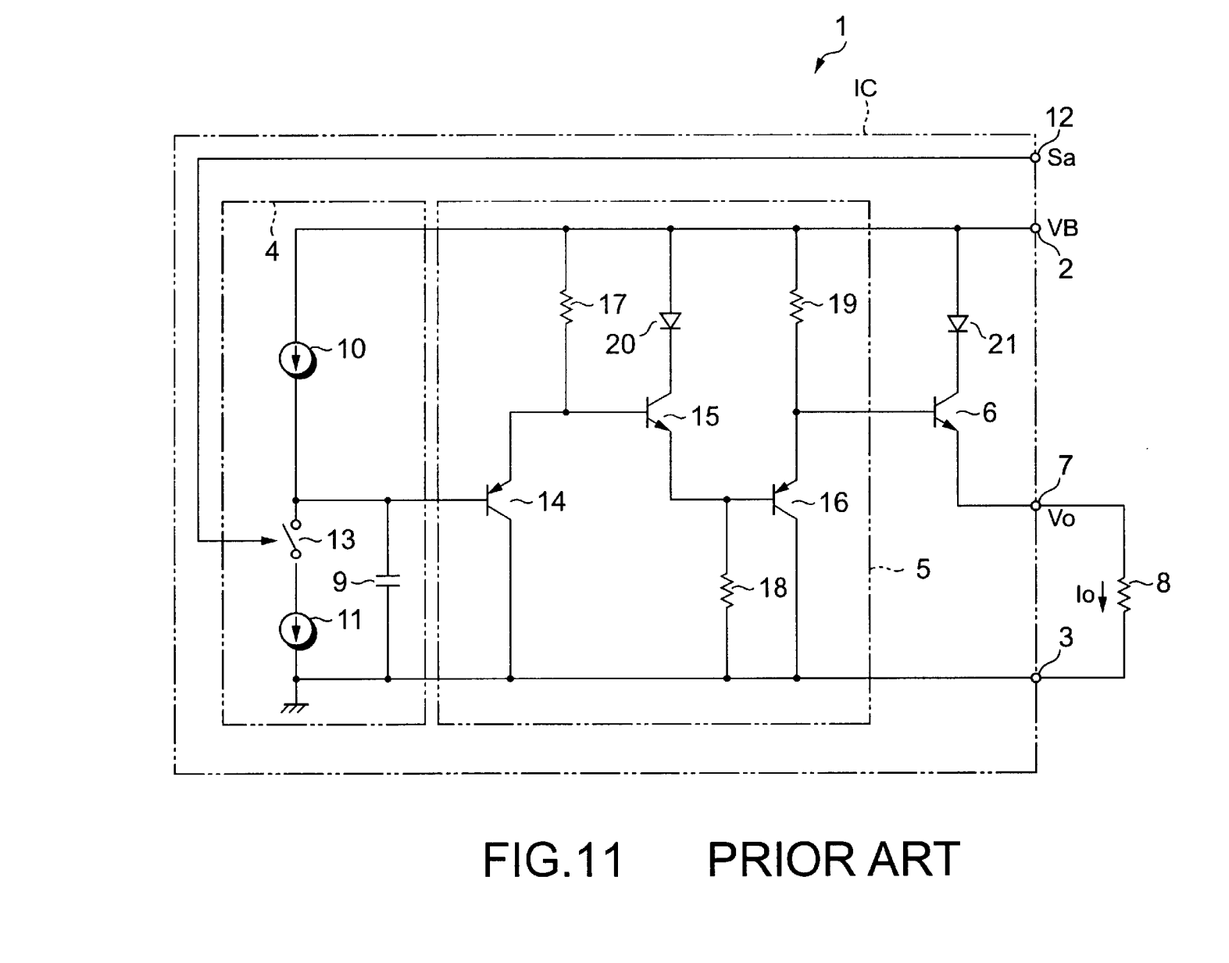
FIG. 11 is a diagram corresponding to FIG. 1, showing a conventional type example.

FIG. 11 is an electrical block diagram of a trapezoidal wave output circuit commonly in use. In FIG. 11, a trapezoidal wave output circuit 1 using IC is operated at relatively high power voltage (e.g. a voltage of 12 V–16 V outputted from a battery) applied between power terminals 2 and 3. Thus, it is designed as bipolar IC, which can be easily turned to highly pressure-proof compared with MOSIC.

The trapezoidal wave output circuit 1 comprises a charge-and-discharge circuit 4, a drive circuit 5 and an output transistor 6, and a load 8 is connected between an output terminal 7 and a power terminal 3. Among these components, the charge-and-discharge circuit 4 comprises a capacitor 9, constant current circuits 10 and 11 for charging or discharging this capacitor 9, and a switching circuit 13 for switching charge-and-discharge operation according to a switching signal Sa given via a control terminal 12. The drive circuit 5 comprises a 3-stage emitter follower circuit, which contains transistors 14, 15 and 16 and resistances 17, 18 and 19. A base current is supplied to an output transistor 6 via the resistance 19. Diodes 20 and 21 are provided to protect the transistors 15 and 6 in case power source is connected reversely.

In the arrangement as described above, a trapezoidal wave voltage is generated according to the switching signal Sa between two terminals of the capacitor 9. This voltage undergoes sequential level-shift by the transistors 14, 15, and 16 and is turned to a base voltage of the output transistor 6. The output transistor 6 also makes up an emitter follower circuit together with the load 8. Eventually, the trapezoidal wave output circuit 1 outputs the terminal voltage of the capacitor 9 to the load without changing the voltage level.

In this case, electric current is amplified by the drive circuit 5 and the output transistor 6. In order that the output transistor 6 can sufficiently drive the load 8 regardless of the value of the output voltage Vo, a sufficiently high base current must be supplied to the output transistor 6 even in case the highest output current Io flows, i.e. in case the output voltage Vo is at the maximum level. Specifically, if it is supposed that maximum voltage value of the output voltage Vo is Vo(max), resistance value of the load 8 is RL, and DC current amplification rate of the output transistor 6 is hFE, then the current value $I_{B1}$ to be supplied to the output transistor 6 is given by the equation given below. Because this base current totally flows via the resistance 19, resistance value of the resistance 19 is determined by the current value $I_{B1}$ and the maximum voltage value Vo(max).

$$I_{B1} \geq (Vo(\max)/RL)/hFE \tag{1}$$

However, when the output voltage Vo is decreased in association with the discharge of the capacitor 9, end-to-end voltage of the resistance 19 is increased in the same extent as the voltage decrease of the output voltage Vo. The electric current flowing to the resistance 19 is increased to a level higher than the electric current value $I_{B1}$ as given by the above equation (1). Also, the base current required for driving the output transistor 6 is decreased by the same extent as the decrease of the output current Io. The increment of the electric current flowing to the resistance 19 and the decrement of the base current are not turned to the base current of the output transistor 6, and these are sent to the power terminal 3 via the transistor 16 as useless current. When it is designed in a circuit configuration provided with a constant current circuit with current value of $I_{B1}$ instead of the resistance 19, the decrement of the base current flows uselessly. As a result, consumption current (i.e. power consumption) of IC is increased, and this leads to the problems such as the increase of chip temperature or deterioration of the battery capacity.

Figure 12:
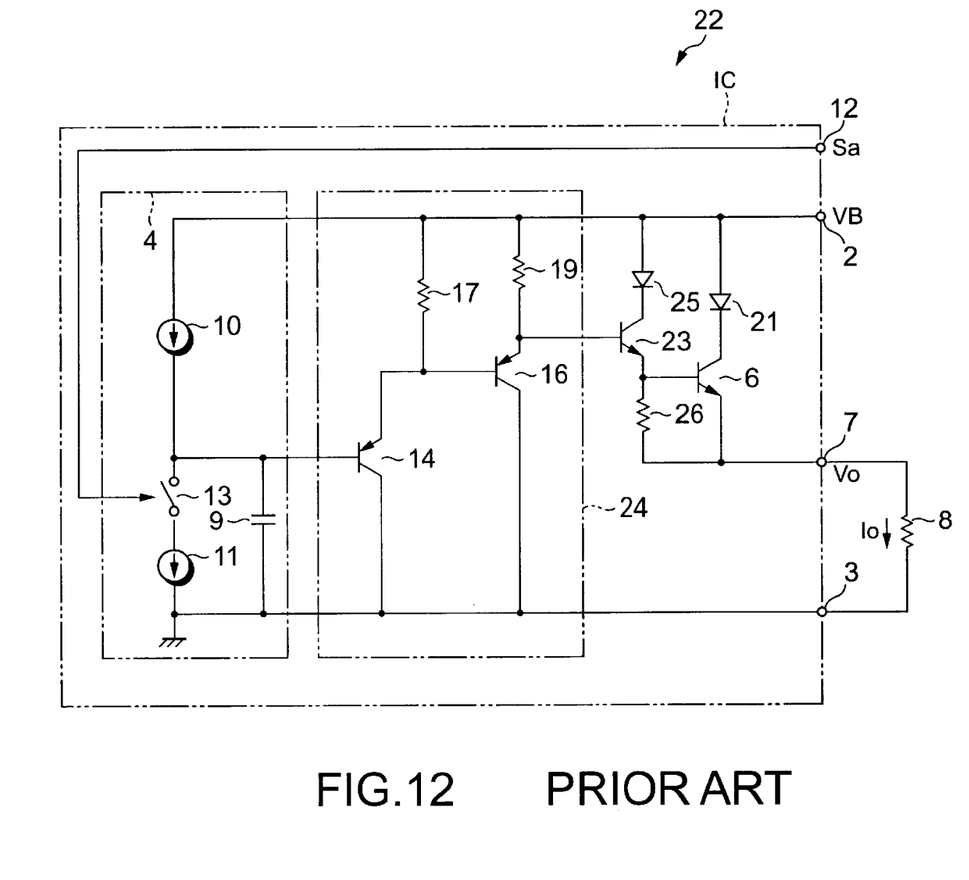
FIG. 12 is a diagram corresponding to FIG. 1, showing another conventional type example.

In contrast, in a trapezoidal wave output circuit 22 as shown in FIG. 12, the output transistor 6 and the transistor 23 are connected by Darlington connection, and the base current to be outputted from the drive circuit 24 is decreased. In this case, the drive circuit 24 comprises a 2-stage emitter follower circuit, which contains transistors 14 and 16 and resistances 17 and 19.

According to this trapezoidal wave output circuit 22, the electric current value $I_{B2}$ to be supplied to the transistor 23 is a value, which is obtained when the current value $I_{B1}$ is divided by DC current amplification rate of the transistor 23. Even when the output voltage Vo is decreased, the uselessly flowing electric current is decreased. However, the output voltage Vo cannot be higher than a value, which is calculated by: (power voltage VB—forward voltage VF of diode 25—collector-emitter voltage of the transistor 23—base-emitter voltage of the transistor 6). Thus, compared with the trapezoidal wave output circuit 1 as described above, maximum voltage value Vo(max) is decreased.

As a result, current output capacity of the trapezoidal wave output circuit 22 may be decreased, or peak value of the trapezoidal wave communication signal may be in shortage and communication error may occur frequently when the power voltage VB is decreased. Also, the collector-emitter voltage of the output transistor 6 is increased by an amount equal to the voltage VF compared with the case of the trapezoidal wave output circuit 1, and this leads to the increase of collector loss. As described above, in the trapezoidal wave output circuits 1 and 22 of the conventional arrangement, it has not been possible to decrease power consumption and to maintain high output voltage Vo at the same time.

SUMMARY OF THE INVENTION

To solve the above problems, it is an object of the present invention to provide an output circuit, by which it is possible to output a voltage corresponding to a charging voltage of a capacitor, and to reduce power consumption while maintaining maximum voltage value to be outputted at high level.

According to the present invention, an output transistor outputs a voltage corresponding to a charging voltage of a capacitor to a load, and electric current corresponding to the output voltage is supplied. The charging voltage of this capacitor is generated by a charge-and-discharge circuit. In general, it is turned to a voltage, which is not a constant voltage but is increased or decreased in similar manner to a trapezoidal wave voltage. According to a drive circuit of this invention, a voltage detection circuit detects the charging voltage of the capacitor, and a variable current circuit supplies a base current corresponding to the detected charging voltage to the output transistor. Specifically, the drive circuit supplies a base current of relatively high value when the output voltage is high and output current of the output transistor is high. When the output voltage is low and the output current of the output transistor is low, a base current of relatively low value is supplied. In this respect, this is different from the drive circuit of the conventional type, in which the base current of the output transistor is determined according to the maximum output voltage only.

As a result, the drive circuit can supply a base current, which is required and sufficient for driving the load to the output transistor, and electric current is not uselessly supplied in the circuit. This makes it possible to reduce consumption current (power consumption) of the drive circuit, and hence, the output circuit. Also, it is possible to prevent deterioration of the capacity of the battery used as power source and to avoid the increase of chip temperature in the IC-using circuit.

Also, the base current is optimized by the use of the voltage detection circuit and the variable current circuit as described above. For instance, there is no need to design the output transistor by Darlington connection to decrease the base current. (Naturally, Darlington connection may be used when it is necessary to supply higher current.) Further, it is possible to maintain the maximum voltage to be outputted.

According to a preferred aspect of the present invention, the voltage detection circuit directly detects the terminal voltage of the capacitor as the charging voltage of the capacitor. As a result, it is possible to accurately detect end-to-end voltage of the capacitor without being influenced from various types of nonlinear circuits in the drive circuit or from temperature change.

Further, according to another preferred aspect of the present invention, the drive circuit comprises an emitter follower circuit. The emitter terminal of each transistor is turned to have a voltage level-shifted by approximately a fixed voltage from the terminal voltage of the capacitor. Thus, the voltage detection circuit can detect the voltage corresponding to the terminal voltage of the capacitor, i.e. the charging voltage of the capacitor.

The emitter follower circuit has high input impedance, and the influence of the drive circuit on the charging of the capacitor is low. Also, the output impedance is low, and there is less influence from the connection of the voltage detection circuit. As a result, the output voltage is turned to a voltage on the same level as the terminal voltage of the capacitor generated by the charge-and-discharge circuit, and voltage distortion is reduced.

According to still another preferred aspect of the present invention, the voltage-current conversion circuit to make up the voltage detection circuit outputs electric current corresponding to the detected charging voltage of the capacitor, and the variable current circuit outputs the base current corresponding to this electric current to the output transistor. Therefore, the base current corresponding to the charging voltage of the capacitor is supplied to the output transistor.

According to still another preferred aspect of the present invention, in the voltage-current conversion circuit to make up the voltage detection circuit, detection voltage given to the base terminal of the transistor for conversion is turned to an emitter voltage level-shifted by an amount equal to the base-emitter voltage VF. As a result, a collector current proportional to the emitter voltage is supplied to the transistor for conversion depending upon resistance value of the resistance for conversion. This collector current is turned to the base current of the output transistor via a current mirror circuit, which serves as the variable current circuit.

According to still another preferred aspect of the present invention, when it is designed using IC, the resistance for conversion is made of chromium silicon having low temperature coefficient. As a result, even when the IC is used under environmental condition with high temperature variation such as the condition in an automobile, it is possible to supply the base current adequately to the output transistor.

According to still another preferred aspect of the present invention, a starting circuit (such as resistance element) is connected between the input terminal of the voltage-current conversion circuit and the power line. As a result, even when the input terminal of the voltage-current conversion circuit has the same node as the output terminal of the current mirror circuit in the drive circuit, it is possible to start and drive the current mirror circuit.

According to still another preferred aspect of the present invention, an offset voltage generating circuit is connected between the input terminal of the voltage-current conversion circuit and the voltage detecting point. As a result, the voltage at the base terminal of the transistor for conversion is increased by an amount of the offset voltage compared with the voltage at the voltage detecting point. Then, the electric current corresponding to the offset voltage is continuously supplied to the transistor for conversion and to the current mirror circuit, and the current mirror circuit can be maintained at the condition of starting. Also, it is possible to reduce waveform distortion of the output voltage, which is likely to occur when the charging voltage of the capacitor is low (e.g. near 0 V).

According to still another preferred aspect of the present invention, the voltage-current conversion circuit of the voltage detection circuit switches over the current value to be outputted to a plurality of stages according to the result of comparison of the detection voltage with the reference voltage, and the variable current circuit outputs the base current corresponding to this electric current to the output transistor. Therefore, the base current corresponding to the charging voltage of the capacitor is supplied to the output transistor.

Further, according to still another preferred aspect of the present invention, a comparator circuit (e.g. comparator) outputs a voltage based on the result of comparison of the detection voltage with the reference voltage. This voltage is given to the base terminal of the transistor for conversion. It is level-shifted by an amount equal to the voltage VF and is turned to an emitter voltage. A collector current proportional to the emitter voltage is supplied to the transistor for conversion. This collector current is turned to the base current of the output transistor via the current mirror circuit, which serves as the variable current circuit.

Also, according to still another preferred aspect of the present invention, the charge-and-discharge circuit is provided with a first and a second constant current circuits for charging and discharging the capacitor. As a result, charging and discharging can be carried out at constant electric current, and it is possible to generate a voltage increased or decreased at a constant slew rate, e.g. a trapezoidal wave voltage.

BRIEF DESCRIPTION OF THE DRAWINGS

The objects and the features of the present invention will be easily understood by referring to the embodiments of the present invention described in connection with the drawings.

DETAILED DESCRIPTION OF THE PREFERRED EMBODIMENT

1st Embodiment

Description will be given below on a first embodiment of the present invention applied to a trapezoidal wave output circuit, referring to FIG. 1 to FIG. 3.

Figure 1:
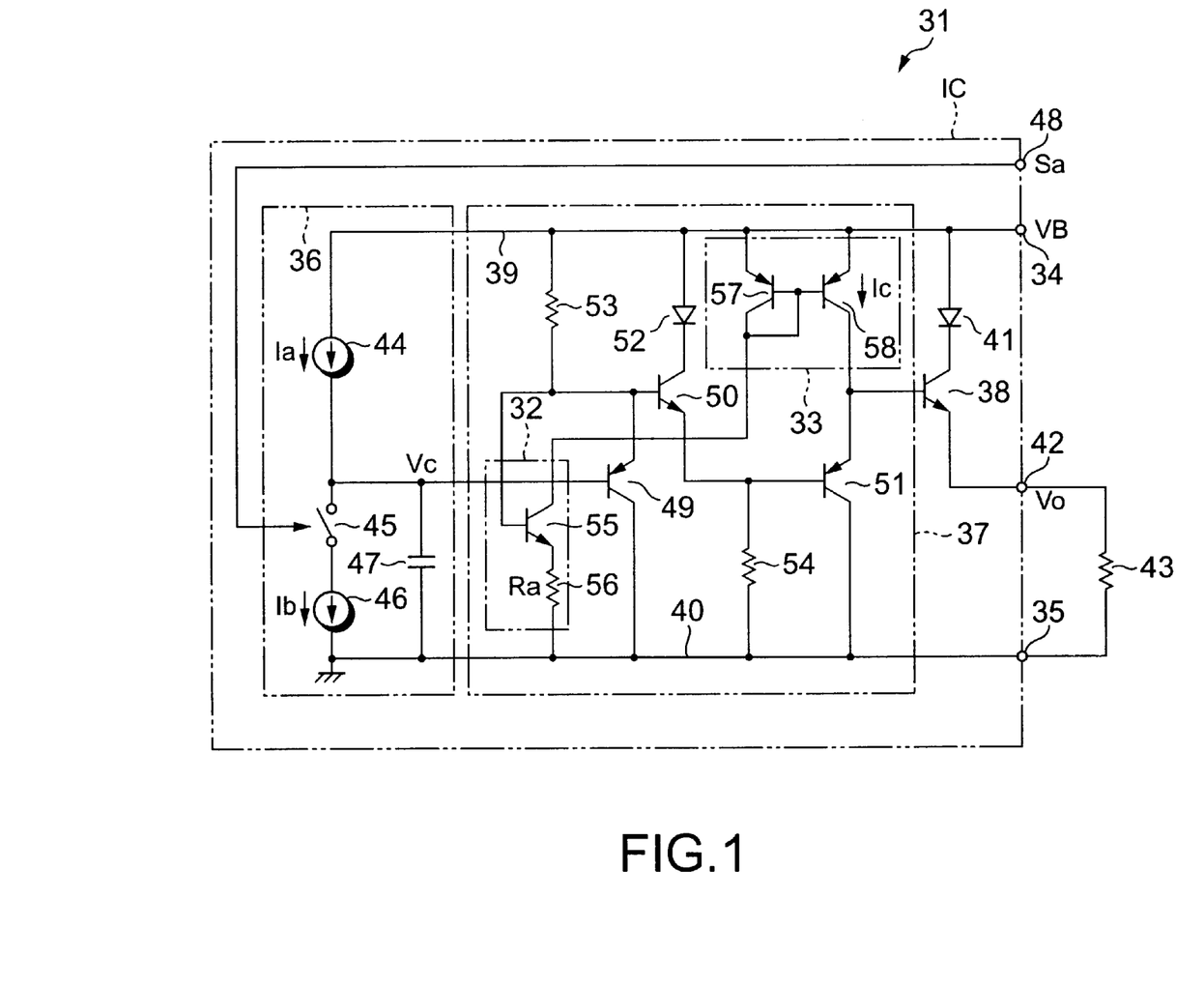
FIG. 1 is an electrical block diagram of a trapezoidal wave output circuit, showing a first embodiment of the present invention.

FIG. 1 is an electrical block diagram of a trapezoidal wave output circuit. A trapezoidal wave output circuit 31 shown in FIG. 1 is designed as an IC-using circuit to be used on board of a vehicle. In particular, it is characterized by a voltage detection circuit 32 and a variable current circuit 33. Also, in order that battery voltage (12 V–16 V) can be directly applied between a power terminal 34 on high potential side of IC and a power terminal 35 on low potential side as a power voltage VB, the IC is designed as a bipolar IC, which can be relatively easily made pressure-proof compared with MOSIC.

In FIG. 1, the trapezoidal wave output circuit 31 comprises a charge-and-discharge circuit 36, a drive circuit 37, an NPN type output transistor 38, etc. Power lines 39 and 40 are connected to the power terminals 34 and 35 respectively. A collector of the output transistor 38 is connected to the power line 39 via a diode 41 for interrupting inverse current with the polarity shown in the figure. An emitter of the output transistor 38 is connected to an output terminal 42. A load 43 is connected between the output terminal 42 and the power terminal 35, and the output transistor 38 positioned on high side with respect to the load 43 is operated in such manner that electric current is supplied to the load 43 (source operation).

In the charge-and-discharge circuit 36 as described above, a constant current circuit 44 (corresponding to a first constant current circuit), a switching circuit 45, and a constant current circuit 46 (corresponding to a second constant current circuit) are connected in series between the power lines 39 and 40. A common connecting point of the constant current circuit 44 and the switching circuit 45 is an output terminal of the charge-and-discharge current 36, and a capacitor 47 is connected between the output terminal and the power line 40. The switching circuit 45 comprises an analog switch, for instance, and it carries out on-off operation according to a switching signal Sa given from outside via a terminal 48.

The drive circuit 37 is an 3-stage amplifier circuit, which comprises a PNP type transistor 49, an NPN type transistor 50, and a PNP type transistor 51. Collectors of the transistors 49–51 are connected to the power lines 39 or 40 respectively either directly or via the diode 52 for interrupting inverse current, and all are in form of emitter follower connection. A base of the first stage transistor 49 is an input terminal for the drive circuit 37 and it is connected to the output terminal for the charge-and-discharge circuit 36. Its emitter is connected to the power line 39 via a resistance 53 and it is also connected to a base of the second stage transistor 50. Further, an emitter of the transistor 50 is connected to the power line 40 via a resistance 54 and is also connected to a base of the third stage transistor 51. The emitter of the transistor 51 is an output terminal of the drive circuit 37, and it is connected to the base of the output transistor 38.

A voltage detection circuit 32 comprising a transistor 55 (corresponding to a transistor for conversion) and a resistance 56 (corresponding to a resistance for conversion) is connected between the emitter of the transistor 49 and the power line 40. The base of the transistor 55 is connected to the emitter of the transistor 49, and the emitter of the transistor 55 is connected to the power line 40 via the resistance 56. The resistance 56 comprises chromium silicon (CrSi) with low temperature change rate.

The variable current circuit 33 is connected between the power line 39 and the output terminal of the drive circuit 37 (emitter of the transistor 51). The variable current circuit 33 is a current mirror circuit, which comprises PNP type transistors 57 and 58. The transistor 57 on input side is connected between the power line 39 and the collector of the transistor 55. The transistor 58 on output side is connected between the power line 39 and the output terminal of the drive circuit 37.

Next, description will be given on operation of the present embodiment referring to FIG. 2 and FIG. 3. A trapezoidal wave voltage outputted from the trapezoidal wave output circuit 31 with the above arrangement is used in a bias circuit for detecting switching condition of the switch installed within a vehicle or in a communication signal output circuit when LAN is installed in the vehicle.

Figure 2:
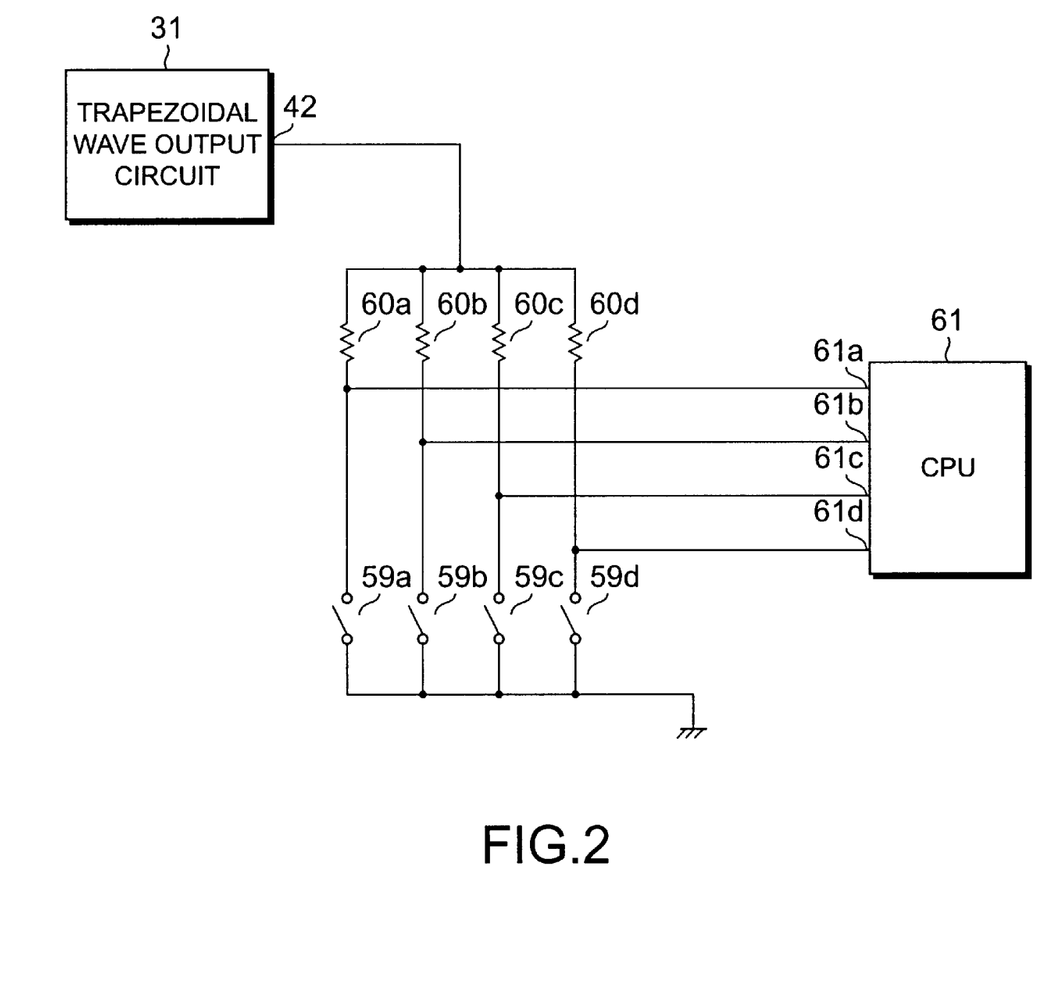
FIG. 2 is an electrical block diagram of a bias circuit for detecting switching condition.

FIG. 2 is an electrical block diagram of the bias circuit. Each terminal of switches 59a–59d is pulled up to an output terminal 42 of the trapezoidal wave output circuit 31 via resistances 60a–60d. Input ports 61a–61d of a CPU 61 installed in an electronic control unit (ECU) are connected respectively to the terminals as described above. The load 43 shown in FIG. 1 represents a circuit, which comprises the switches 59a–59d and the resistances 60a–60d.

In this case, in order to reduce consumption current, the trapezoidal wave output circuit 31 is designed to output the trapezoidal wave voltage according to the switching signal Sa only when CPU 61 reads the conditions of the switches 59a–59d. The trapezoidal wave voltage has low slew rate in leading and trailing edges and induction radiation is reduced, and this contributes to the reduction of radio noise compared with the case where rectangular wave voltage is used.

Figure 3:
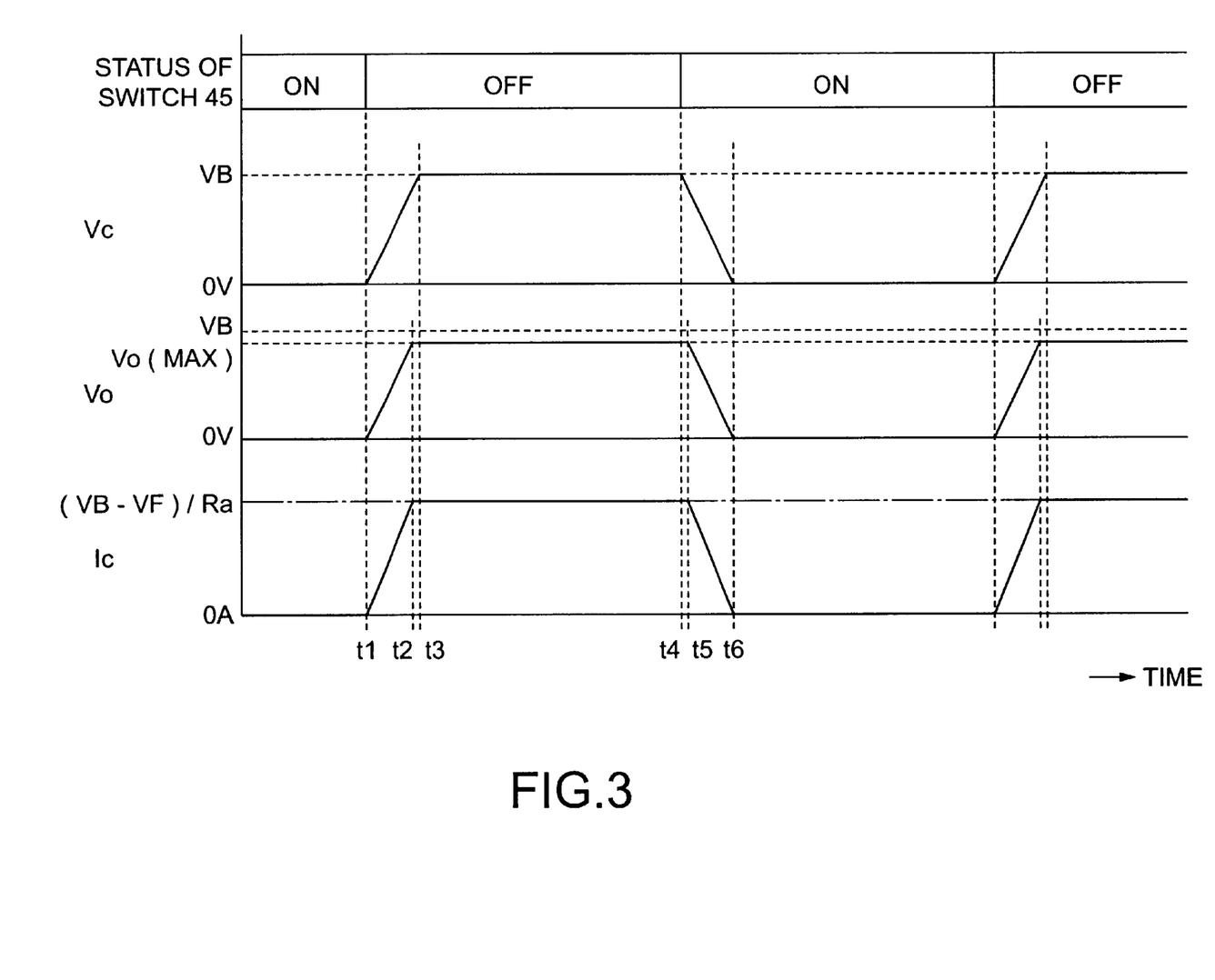
FIG. 3 is a diagram showing voltage waveform of each part when a trapezoidal wave voltage is generated.

FIG. 3 represents on-off condition of a switching circuit 45, waveform of a terminal voltage Vc of the capacitor 47 (i.e. output voltage of the charge-and-discharge circuit 36), waveform of an output voltage Vo at the output terminal 42, and waveform of electric current Ic supplied from the variable current circuit 33. In FIG. 3, when the switching signal Sa is turned to L level at a time t1, the switching circuit 45 is turned off. The terminal voltage Vc of the capacitor 47 is increased at a given slew rate due to an electric current Ia outputted from the constant current circuit 44. Although not shown in the figure, output of the constant current circuit 44 comprises a current mirror circuit. The terminal voltage Vc is increased until it nearly reaches a power voltage VB, and the voltage VB is maintained after the time of arrival t3.

On the other hand, when the switching signal Sa is turned to H level at a time t4, the switching circuit 45 is turned on. The terminal voltage Vc at the capacitor 49 is decreased at a given slew rate due to difference of electric current (Ib−Ia) between the current Ib of the constant current circuit 46 and the electric current Ia of the constant current circuit 44. The output of the constant current circuit 46 also comprises a current mirror circuit, and the terminal voltage Vc is decreased until it reaches nearly the level of about 0 V, and the voltage of 0 V is maintained after the time of arrival t6.

The terminal voltage Vc of the capacitor 47 is given to the base of the transistor 49, and the level of the voltage is shifted by the base-emitter voltage VF between base and emitter, and it is outputted to the emitter. The transistor 49 comprising an emitter follower circuit serves as a buffer circuit because it has high input impedance and low output impedance. As a result, the transistor 49 can transmit the terminal voltage Vc with trapezoidal wave to the next stage transistor 50 without changing the waveform.

The transistor 50 and the subsequent stage transistor 51 also comprise emitter following circuits respectively. These are operated as buffer circuits and perform level-shifting and current amplification. Thus, the emitter voltage of the transistor 51 is turned to a level higher than the terminal voltage Vc of the capacitor 47 by an amount of the voltage VF. The voltage between the base and emitter of the output transistor 38 is decreased by an amount of the voltage VF, and it is eventually equalized with the terminal voltage Vc of the capacitor 47.

However, bias voltage is required for the transistors 58 and 38, and maximum value Vo(max) of the output voltage Vo is turned to: (power voltage VB−$V_{CE}$ of the transistor 58−$V_{BE}$ of the output transistor 38). As shown in FIG. 3, during the period from the time t1 to the time t2 when the maximum value Vo(max) is reached, the output voltage Vo is increased in the same manner as the terminal voltage Vc of the capacitor 47, and the maximum value Vo(max) is maintained after the time t2. For the period after the time t4, the output voltage Vo maintains the maximum value Vo(max) up to the time t5 when the terminal voltage Vc of the capacitor 47 is decreased to the maximum value Vo(max). Thereafter, it is decreased in the same manner as the terminal voltage Vc.

Because the load 43 is a resistance load, a collector current proportional to the output voltage Vo is sent to the output transistor 38. To drive the output transistor 38 to full extent, a base current is required, which is obtained when the collector current is divided by DC current amplification rate hFE. At the trapezoidal wave output circuit 31, this base current is generated as follows:

Specifically, the emitter voltage of the transistor 49 is (Vc+VF), and the emitter voltage of the transistor 55 is turned to the terminal voltage Vc. The voltage detection circuit 32 is a voltage-current conversion circuit, and a collector current of (Vc/Ra) (where Ra represents resistance value of the resistance 56) is supplied the transistor 55. The collector current is supplied to the current mirror circuit, which makes up the variable current circuit 33. As a result, the terminal voltage Vc of the capacitor, i.e. a trapezoidal wave current proportional to the output voltage Vo, is sent to the transistor 58 as shown in FIG. 3. Most of the current Ic is the base current of the output transistor 38. Thus, if the resistance value Ra is set depending on the resistance value of the load 43 and the DC current amplification rate hFE as described above, the drive circuit 37 can supply the base current required and sufficient for driving the load 43 to the output transistor 38. In the conventional type system (using a constant current circuit instead of the resistance 19 in the trapezoidal wave output circuit 1 shown in FIG. 11), the current corresponding to the electric current Ic is as shown by one-dot chain line in FIG. 3, and it takes a constant value regardless of the value of the output voltage Vo.

As described above, according to the present embodiment, the drive circuit 37 comprises the voltage detection circuit 32 and the variable current circuit 33, and the base current approximately proportional to the terminal voltage Vc of the capacitor 47, i.e. the base current required and sufficient for driving the load 43, is supplied to the output transistor 38. As a result, no useless current flows to the drive circuit 37. For this reason, consumption current (power consumption) of the trapezoidal wave output circuit 31 can be decreased, and it is possible to reduce deterioration of the battery capacity and temperature increase of IC. The smaller the duty ratio of the output voltage Vo (the ratio of time when the output voltage Vo is turned to a value near 0 V) is, the higher effect is obtained.

The trapezoidal wave output circuit 31 can output up to the maximum value Vo(max) (=VB−$V_{CE}$−$V_{BE}$) as the output voltage Vo. Compared with the system as shown in FIG. 12, it is possible to output higher voltage. Therefore, CPU 61 can read the on-off condition of the switches 59a–59d correctly even when the battery voltage is low.

Further, because the resistance 56 of the voltage detection circuit 32 is made of chromium silicon, which has lower temperature change rate, even when the temperature of IC is changed, no problem occurs, such as the decrease of the output voltage Vo due to the shortage of the base current or the increase of the consumption current to a level more than actually required as the excessive base current flows.

2nd Embodiment

Figure 4:
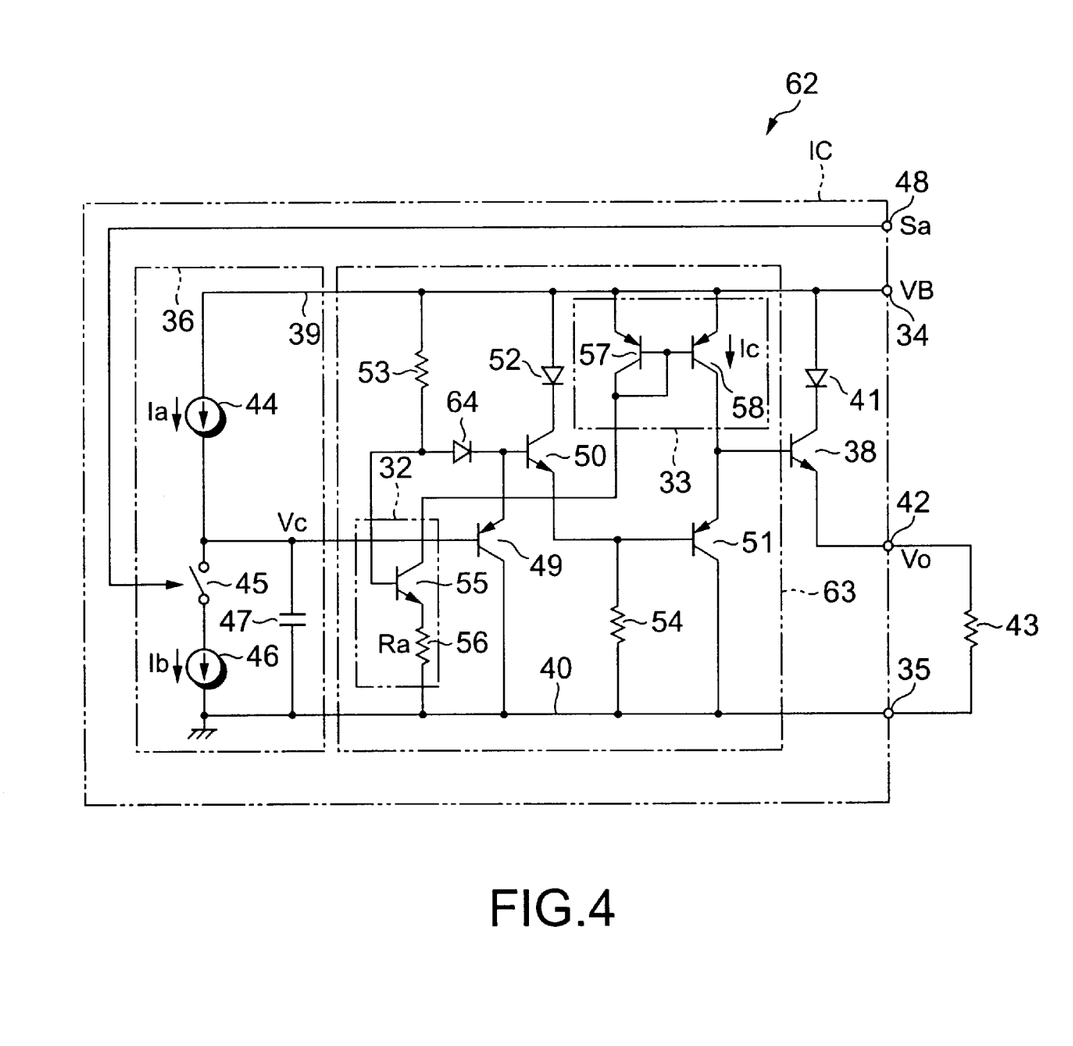
FIG. 4 is a block diagram corresponding to FIG. 1, showing a second embodiment of the present invention.

Next, description will be given on a second embodiment of the present invention applied to a trapezoidal wave output circuit referring to FIG. 4 and FIG. 5. In FIG. 4, which is an electrical block diagram of the trapezoidal wave output circuit, the same component as in FIG. 1 is referred by the same symbol, and description is given here only on components and features different from those of FIG. 1.

A trapezoidal wave output circuit 62 shown in FIG. 4 is partially different in the drive circuit 63 from the trapezoidal wave output circuit 31 shown in FIG. 1. Specifically, in the drive circuit 63, a diode 64 of the polarity shown in the figure (corresponding to an offset voltage generating circuit) is connected between the input terminal of the voltage detection circuit 32 (the base of the transistor 55) and the emitter of the transistor 49.

Figure 5:
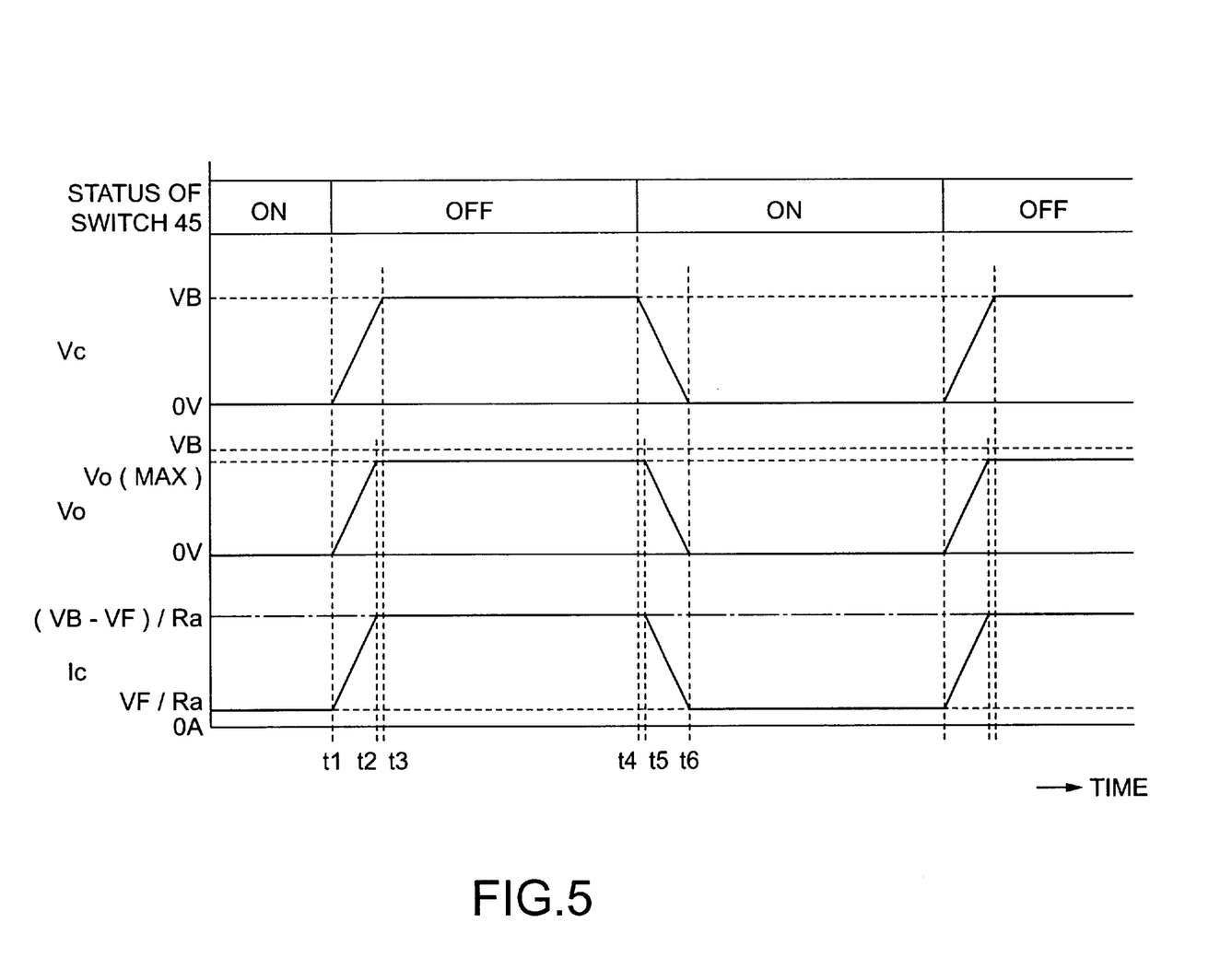
FIG. 5 is diagram corresponding to FIG. 3.

FIG. 5 corresponds to FIG. 3 as explained in the first embodiment. When the diode 64 is added, the emitter voltage of the transistor 55 is increased by an amount of VF, and it is turned to (Vc+VF). As a result, as shown in FIG. 5, even when the terminal voltage Vc is 0 V, offset current of (VF/Ra) is continuously supplied to the transistors 55, 57 and 58. In this case, the voltage VF (approx. 0.7 V) is sufficiently lower than the power voltage VB (battery voltage: 12 V–16 V), and the offset current flowing at the voltage VF is also substantially lower. Thus, the increase of the consumption current is also low.

In the trapezoidal wave output circuit 31, to which the diode 64 is not added, the emitter voltage of the transistor 55 is equalized with the terminal voltage Vc of the capacitor 47. In this case, if the base-emitter voltage of the transistor 55 is higher than the base-emitter voltage VF of the transistor 49, no current is supplied to the bases of the transistors 55, 57 and 58 and the output transistor 38 when the terminal voltage Vc is near 0 V and distortion occurs in the output voltage Vo.

In contrast, in the trapezoidal wave output circuit 62 of the present embodiment, the base voltage of the transistor 55 is set to a level higher a by an amount of the voltage VF due to the use of the diode 64, and offset current is always sent to the transistors 55, 57 and 58. Therefore, even when the terminal voltage Vc is near 0 V, the base current can be supplied to the output transistor 38, and no distortion occurs in the output voltage Vo.

3rd Embodiment

Figure 6:
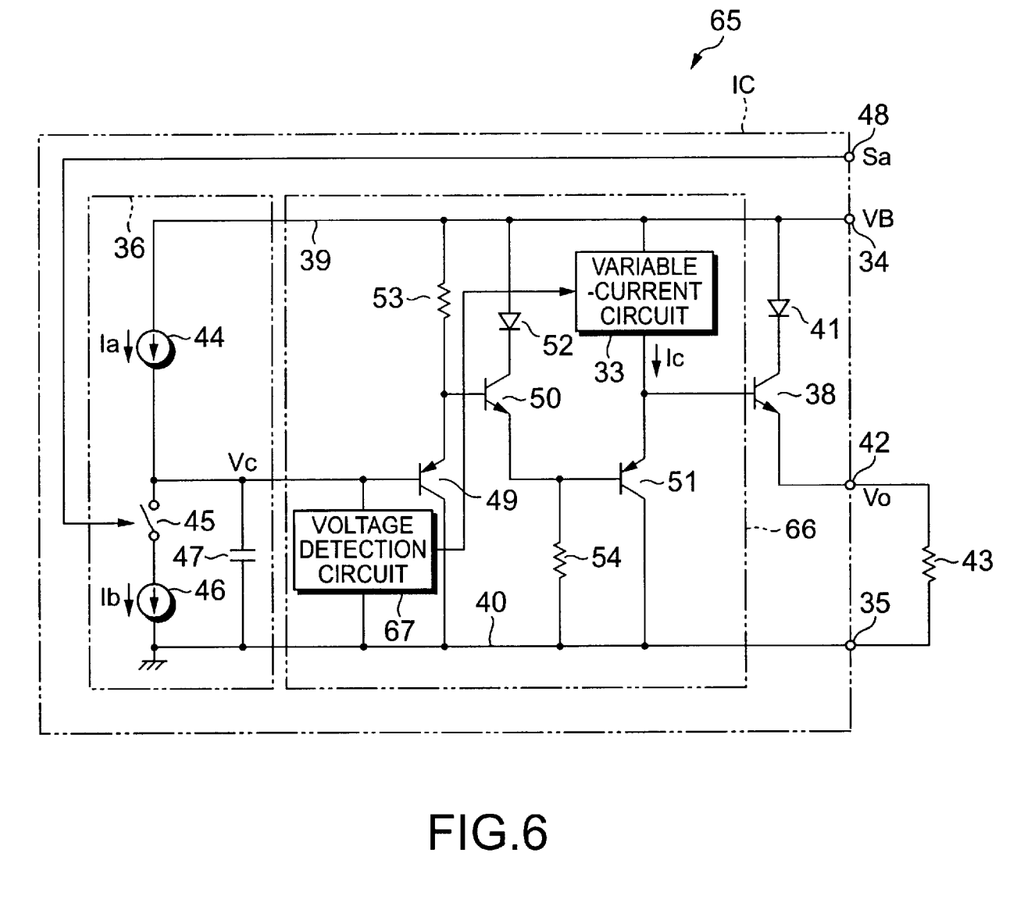
FIG. 6 is a diagram corresponding to FIG. 1, showing a third embodiment of the present invention.

FIG. 6 is an electrical block diagram of a trapezoidal wave output circuit 65 of a third embodiment of the present invention. The same component as in FIG. 1 is referred by the same symbol. In FIG. 6, a voltage detection circuit 67 is connected between the base of a transistor 49 of a drive circuit 66 and a power line 40. The voltage detection circuit 67 comprises a voltage-current conversion circuit, which has sufficiently high input impedance, and electric current proportional to the terminal voltage Vc is supplied to a variable current circuit 33.

The voltage detection circuit 67 directly detects the terminal voltage Vc of the capacitor 47, and more correct voltage can be detected, and it is possible to accurately perform the control of the base current of the output transistor 38, i.e. the control to decrease the consumption current. In the present embodiment, the voltage detection circuit 67 is connected between two terminals of the capacitor 47. In this respect, for the purpose of reducing the influence of the capacitor to the electric charge to be charged, it is preferable to increase capacitance of the capacitor 47 or to set the current values la and lb of the constant current circuits 44 and 46 to higher level.

4th Embodiment

Figure 7:
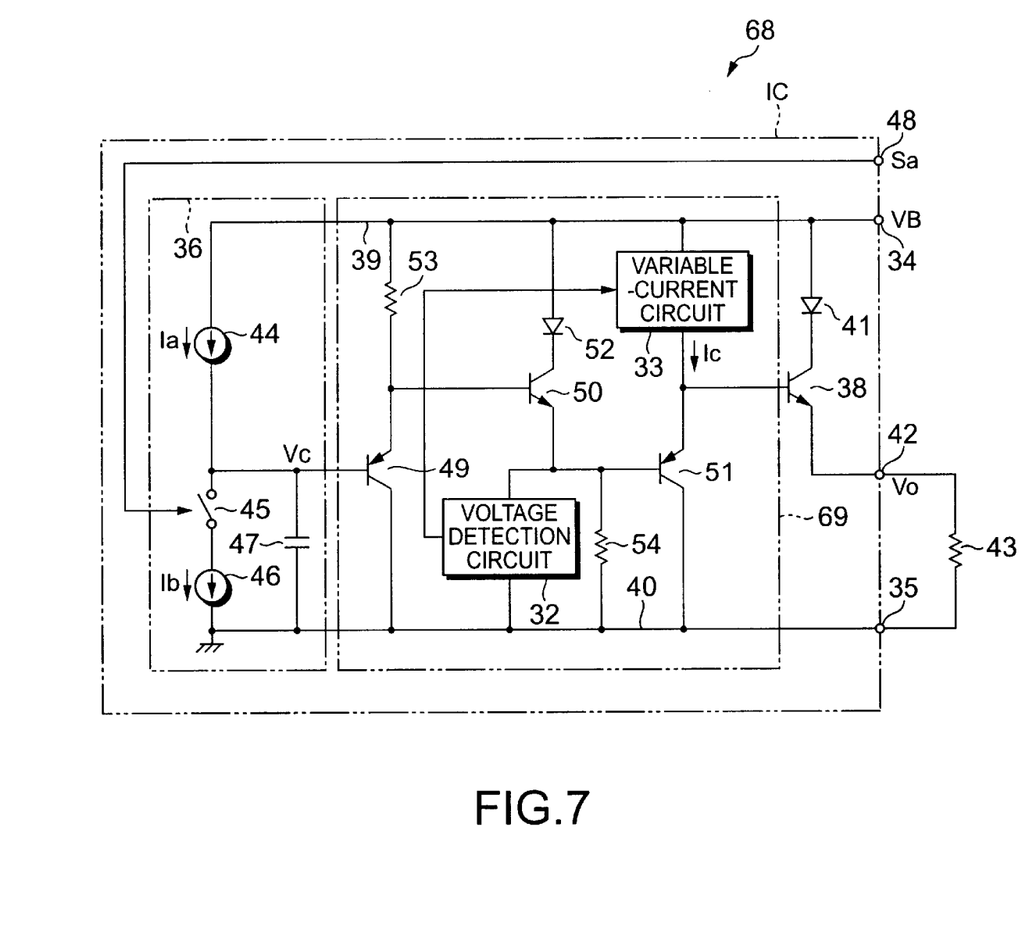
FIG. 7 is a diagram corresponding to FIG. 1, showing a fourth embodiment of the present invention.

FIG. 7 is an electrical block diagram of a trapezoidal wave output circuit 68 of a fourth embodiment of the present invention. The same component as in FIG. 1 is referred by the same symbol. In FIG. 7, a voltage detection circuit 32 is connected between the emitter of the second stage transistor 50 of a drive circuit 69 and the power line 40. In this case, output impedance of the transistor 50 serving as a buffer circuit is low, and the voltage detection circuit 32 used in the trapezoidal wave output circuit 31 can be used without change. The emitter voltage of the transistor 50 is equal to the terminal voltage Vc of the capacitor 47, and it is possible to achieve the actions and the effects similar to those of the first embodiment.

5th Embodiment

Figure 8:
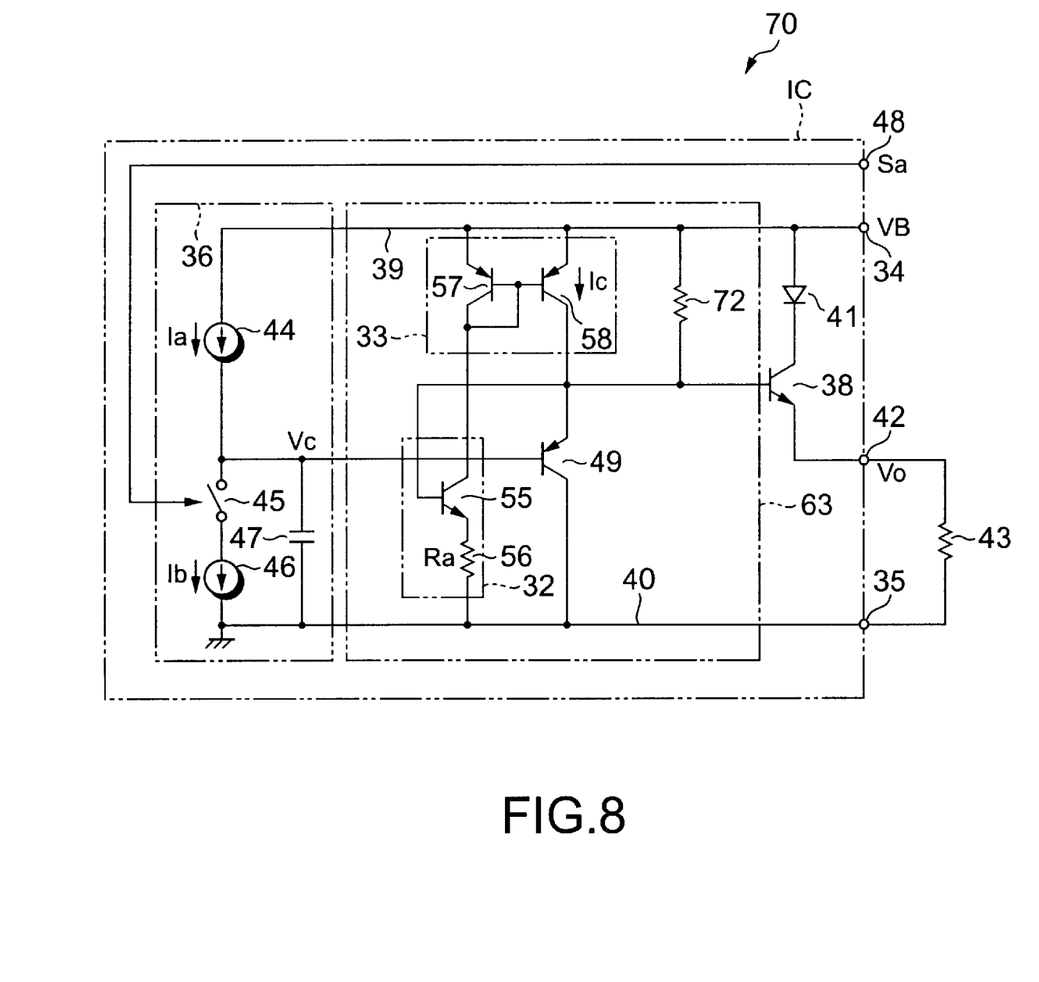
FIG. 8 is a diagram corresponding to FIG. 1, showing a fifth embodiment of the present invention.

In the first to the fourth embodiments as described above, the drive circuit comprises a 3-stage emitter follower circuit, but the number of stages of the drive circuit is not limited to this. FIG. 8 is an electrical block diagram of a trapezoidal wave output circuit 70 of a fifth embodiment of the present invention. The same component as in FIG. 1 is referred by the same symbol. In FIG. 8, a drive circuit 71 comprises a one-stage emitter follower circuit containing a transistor 49. The emitter of the transistor 49 is connected to the base of the output transistor 38. A voltage detection circuit 32 and a variable current circuit 33 are connected respectively between the emitter of the transistor 49 and the power lines 39 and 40.

By the drive circuit 71 of the present embodiment, it is also possible to supply the base current proportional to the terminal voltage Vc of the capacitor 47 to the output transistor 38, and the same effects as in the first embodiment can be obtained. In the drive circuit 71, however, the input terminal of the voltage detection circuit 32 (the base of the transistor 55) is biased by the variable current circuit 33 due to the output current of the voltage detection circuit 32. In this respect, a starting resistance 72 (corresponding to a starting circuit) is connected between the base of the transistor 55 and the power line 39. This starting resistance 72 has high resistance value, and there is almost no increase of consumption current due to the addition of the starting resistance 72. For this reason, even when the terminal voltage Vc is near 0 V, the transistors 49, 55, 57 and 58 are always biased to the status of ON operation, and starting failure or starting delay can be avoided. Also, it is possible to reduce waveform distortion in the output voltage Vo.

6th Embodiment

Figure 9:
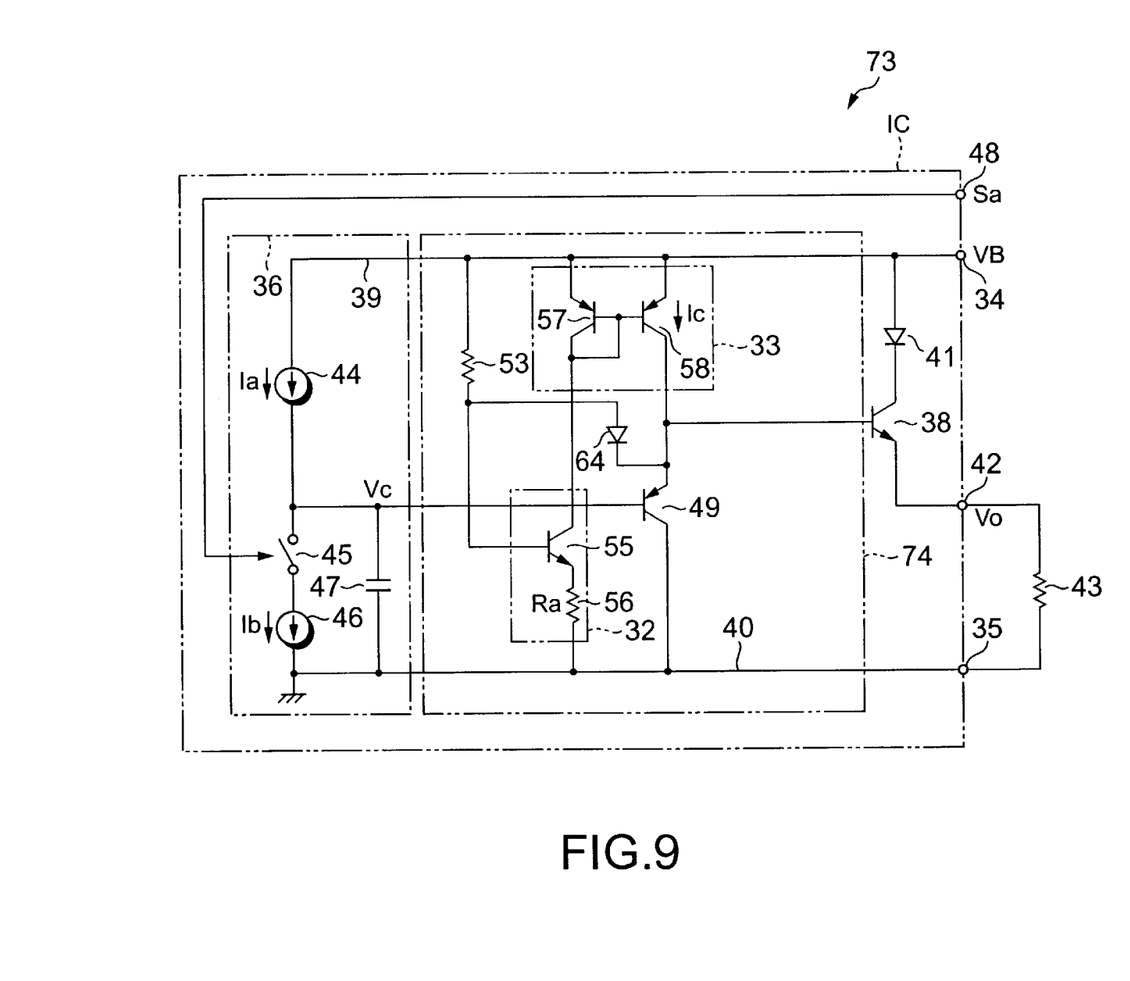
FIG. 9 is a diagram corresponding to FIG. 1, showing a sixth embodiment of the present invention.

FIG. 9 is an electrical block diagram of a trapezoidal wave output circuit 73 of a sixth embodiment of the present invention. The same component as in FIG. 4 or FIG. 8 is referred by the same symbol. In the drive circuit 74 of the trapezoidal wave output circuit 73, a resistance 53 and a diode 64 (offset voltage generating circuit) similar to those of the trapezoidal wave output circuit 62 shown in FIG. 4 are added instead of the starting resistance 72 of FIG. 8.

The operation of this diode 64 is as explained in connection with the second embodiment, and offset current is continuously sent to the transistors 49, 55, 57 and 58. Therefore, it is possible to prevent starting failure and starting delay and to reduce waveform distortion in the output voltage Vo.

7th Embodiment

Figure 10:
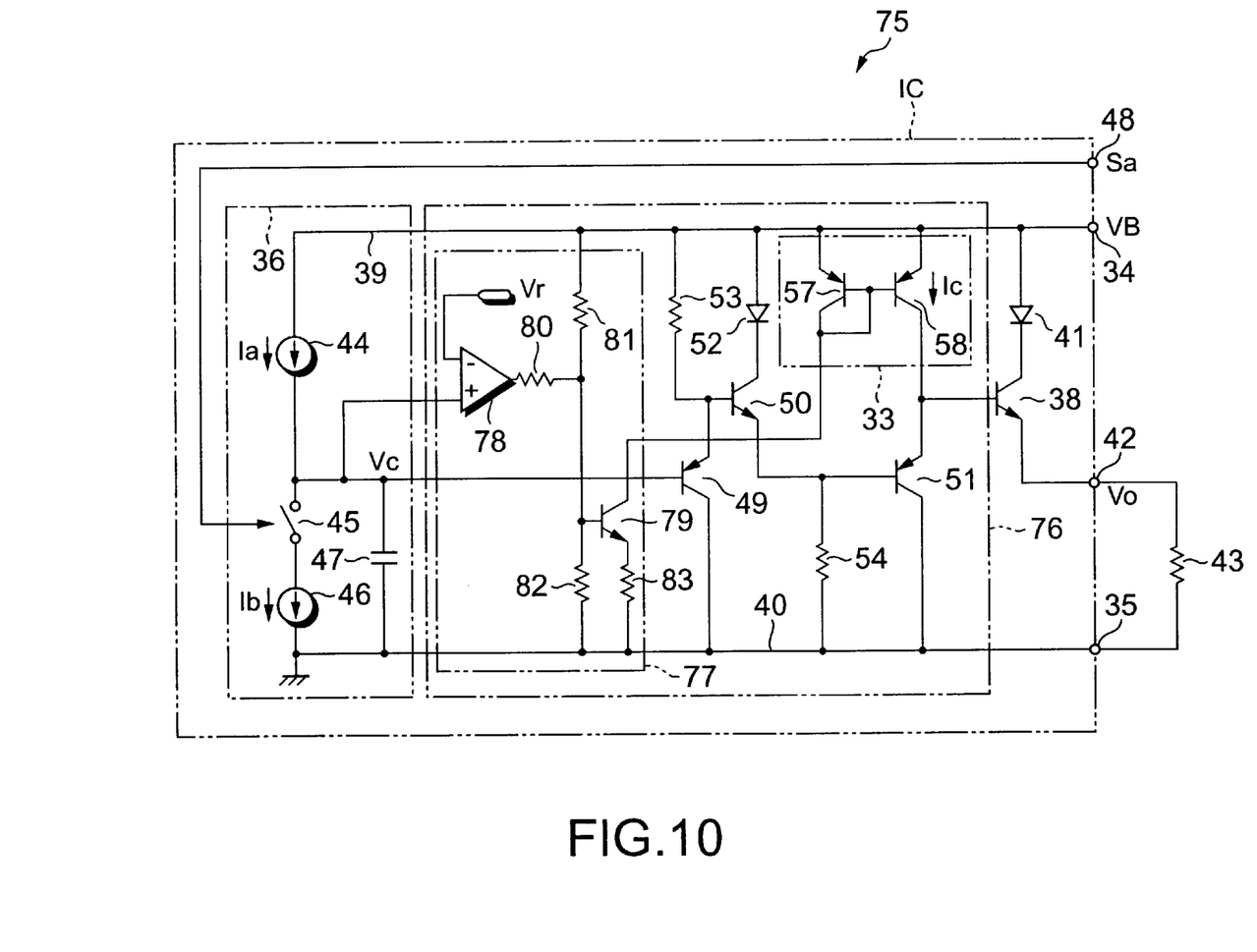
FIG. 10 is a diagram corresponding to FIG. 1, showing a seventh embodiment of the present invention.

FIG. 10 is an electrical block diagram of a trapezoidal wave output circuit of a seventh embodiment of the present invention. The same component as in FIG. 1 is referred by the same symbol. In FIG. 10, the drive circuit 76 is provided with a voltage detection circuit 77 for detecting the terminal voltage Vc of the capacitor 47.

This voltage detection circuit 77 is a voltage-current conversion circuit, and it comprises a comparator 78 (corresponding to a comparator circuit), an NPN type transistor 79 in form of an open collector (corresponding to a transistor for conversion), and resistances 80–83. Non-inversion input terminal of the comparator 78 is connected to the output terminal of the charge-and-discharge circuit 36, and an inversion input terminal is connected to a reference voltage generating circuit (not shown) to generate a reference voltage Vr. Also, the output terminal of the comparator 78 is connected to the base of the transistor 79 via the resistance 80, and the resistances 81 and 82 for setting bias are connected respectively between the base and the power lines 39 and 40. The emitter of the transistor 79 is connected to the power line 40 via the resistance 83 (corresponding to the resistance for conversion), and the collector is connected to the collector of the transistor 57, which makes up the variable current circuit 33.

In the arrangement as described above, when the terminal voltage Vc is lower than the reference voltage Vr, the comparator 78 outputs a voltage of L level, and a relatively low voltage V1 of a given level is provided to the base of the transistor 79. On the other hand, when the terminal voltage Vc is higher than the reference voltage Vr, the comparator 78 outputs a voltage of H level, and a relatively high voltage V2 (>V1) of a given level is provided to the base of the transistor 79. The emitter voltage of the transistor 79 is turned to a level lower than the base voltage by an amount of VF, and a collector current proportional to this emitter voltage is supplied to the transistor 79. This collector current is turned to a base current of the output transistor 38 via the variable current circuit 33.

According to this trapezoidal wave output circuit 75, the base current of the output transistor 38 is changed to two stages depending on the value of the terminal voltage Vc, i.e. the output voltage Vo. As a result, the base current is decreased, which flows uselessly when the output voltage Vo is decreased. Compared with the trapezoidal wave output circuit 1 (FIG. 11) of the conventional system, consumption current can be reduced.

Other Embodiments

The present invention is not limited to the embodiments as described above and shown in the figures. For instance, variation or extension of the invention is conceivable as follows:

In the above embodiments, it is designed that trapezoidal wave voltage is outputted, while voltage other than the trapezoidal wave voltage may be outputted by charging and discharging of the capacitor 47.

The drive circuit is not limited to the emitter follower circuit, and other circuit arrangement may be used. In this case, the voltage detection circuit should be connected to a node where a voltage corresponding to the terminal voltage Vc of the capacitor 47 emerges.

In the trapezoidal wave output circuit, it may be designed in such manner that the connection to the power lines 39 and 40 may be reversed and the types of the transistors may be changed between PNP type and NPN type so that the PNP type output transistor is positioned on low side with respect to the load 43. In this case, the output transistor is turned to current sucking operation (sinking operation).

In the first embodiment, the voltage detection circuit 32 may be provided in such manner that it detects the emitter voltage of the transistor 51. In this case, as already described in connection with the second and the fifth embodiments, it is preferable to add the diode 64 or the starting resistance 72.

In the seventh embodiment, the base current of the output transistor 38 was changed to two stages depending on the values of the output voltage Vo, while it may be changed in multiple stages by providing a plurality of comparators. Also, the comparator circuit is not limited to a comparator.

What is claimed is:

1. An output circuit, comprising:
a charge-and-discharge circuit having a capacitor and for performing charging and discharging to said capacitor;
an output transistor connected in series to a load; and
a drive circuit for driving said output transistor based on a charging voltage of said capacitor so that said output transistor outputs a voltage corresponding to the charging voltage of said capacitor to said load, whereby:
said drive circuit comprises:
a voltage detection circuit for detecting the charging voltage of said capacitor; and
a variable current circuit for outputting a base current corresponding to the charging voltage of said capacitor detected by said voltage detection circuit to said output transistor.

2. The output circuit according to claim 1, wherein said voltage detection circuit directly detects terminal voltage of said capacitor.

3. The output circuit according to claim 1, wherein said drive circuit uses the terminal voltage of said capacitor as an input and comprises one or a plurality of transistors connected in one stage or in multiple stages in form of an emitter follower; and
said voltage detection circuit detects voltage of an emitter terminal of said transistor.

4. The output circuit according to claim 1, wherein:
said voltage detection circuit comprises a voltage-current conversion circuit for outputting electric current corresponding to the detection voltage; and
said variable current circuit outputs a base current corresponding to the output current of the voltage-current conversion circuit to said output transistor.

5. The output circuit according to claim 4, wherein:
said charge-and-discharge circuit and said drive circuit are connected between a pair of electric power lines;
said voltage-current conversion circuit comprises a transistor for conversion in form of an open collector and a resistance for conversion connected between an emitter of said transistor for conversion and said power line; and
said variable current circuit comprises a current mirror circuit.

6. The output circuit according to claim 5, wherein said resistance for conversion comprises chromium silicon when said circuit is turned to an IC-using circuit.

7. The output circuit according to claim 5, wherein a starting circuit is connected between the input terminal of said voltage-current conversion circuit and said power line.

8. The output circuit according to claim 5, wherein an offset voltage generating circuit is connected between the input terminal of said voltage-current conversion circuit and a voltage detecting point.

9. The output circuit according to claim 1, wherein said voltage detection circuit comprises a voltage-current conversion circuit for outputting electric current based on result of comparison of the detection voltage with a reference voltage; and
said variable current circuit outputs a base current corresponding to an output current of said voltage-current conversion circuit to said output transistor.

10. The output circuit according to claim 9, wherein said charge-and-discharge circuit and said drive circuit are connected between a pair of power lines;
said voltage-current conversion circuit comprises a comparator circuit for comparing said detection voltage with said reference voltage, a transistor for conversion in form of an open collector connected to an output terminal of said comparator circuit, and a resistance for conversion connected between an emitter of the transistor for conversion and said power line; and
said variable current circuit comprises a current mirror circuit.

11. The output circuit according to claim 1, wherein said charge-and-discharge circuit comprises a first constant current circuit for charging said capacitor, and a second constant circuit for discharging said capacitor.

* * * * *